United States Patent
Kim et al.

(10) Patent No.: US 7,282,319 B2
(45) Date of Patent: Oct. 16, 2007

(54) PHOTORESIST COMPOSITION AND METHOD OF FORMING A PATTERN USING SAME

(75) Inventors: Kyoung-Mi Kim, Gyeonggi-do (KR); Yeu-Young Youn, Seoul (KR); Youn-Kyung Wang, Gyeonggi-do (KR); Jae-Ho Kim, Gyeonggi-do (KR); Young-Ho Kim, Gyeonggi-do (KR); Boo-Deuk Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 127 days.

(21) Appl. No.: 11/141,736

(22) Filed: May 31, 2005

(65) Prior Publication Data

US 2005/0266342 A1    Dec. 1, 2005

(30) Foreign Application Priority Data

May 31, 2004    (KR)    ............. 10-2004-0038896

(51) Int. Cl.
 G03F 7/039    (2006.01)
 G03C 7/30    (2006.01)

(52) U.S. Cl. .................. 430/270.1; 430/323; 430/326; 430/914; 430/921

(58) Field of Classification Search ............. 430/270.1, 430/323, 326, 914, 921
See application file for complete search history.

(56) References Cited

U.S. PATENT DOCUMENTS 5,968,713 A * 10/1999 Nozaki et al. ............. 430/326
6,200,728 B1    3/2001 Cameron et al.
6,277,538 B1 *  8/2001 Choi et al. ................ 430/270.1
6,447,980 B1 *  9/2002 Rahman et al. .......... 430/270.1
6,541,179 B2 *  4/2003 Hatakeyama et al. ..... 430/270.1
6,991,888 B2 *  1/2006 Padmanaban et al. ... 430/270.1
2004/0009430 A1 *  1/2004 Kanna et al. ............. 430/287.1
2005/0277056 A1 * 12/2005 Kim et al. ................ 430/270.1

FOREIGN PATENT DOCUMENTS

| JP | 5-323599 | 12/1993 |
| JP | 9-73173 | 3/1997 |
| JP | 9-90637 | 4/1997 |
| JP | 10-161313 | 6/1998 |
| JP | 11-202479 | 7/1999 |

(Continued)

OTHER PUBLICATIONS

English language abstract of the Japanese Publication No. 5-323599, Dec. 1993.

(Continued)

*Primary Examiner*—Richard L. Schilling
(74) *Attorney, Agent, or Firm*—Marger Johnson & McCollom, P.C.

(57) ABSTRACT

A photoresist composition for preventing exposing failures and a method of forming a pattern using the same are disclosed. The photoresist composition preferably comprises about 0.1% to about 0.5% by weight of a photo acid generator, and about 2% to about 10% by weight of a polymer resin, the PAG including a monophenyl sulfonium compound, a triphenyl sulfonium compound or a mixture thereof. The footing phenomenon and the top loss of a pattern are sufficiently prevented.

21 Claims, 8 Drawing Sheets

FOREIGN PATENT DOCUMENTS

| | | |
|---|---|---|
| JP | 2002-207289 | 7/2002 |
| KR | 2003-0002365 | 1/2003 |
| KR | 2003-0079908 | 10/2003 |

OTHER PUBLICATIONS

English language abstract of the Japanese Publication No. 9-73173, Mar. 1997.

English language abstract of the Japanese Publication No. 9-90637, Apr. 1997.

English language abstract of the Japanese Publication No. 10-161313, Jun. 1998.

English language abstract of the Japanese Publication No. 11-202479, Jul. 1999.

English language abstract of the Japanese Publication No. 2002-207289, Jul. 2002.

English language abstract of the Korean Publication No. 2003-0002365, Jan. 2003.

* cited by examiner

PHOTORESIST COMPOSITION AND METHOD OF FORMING A PATTERN USING SAME

CROSS-REFERENCE TO RELATED APPLICATION

This application claims priority from Korean Patent Application No. 2004-38896 filed on May 31, 2004, the content of which is herein incorporated by reference in its entirety.

BACKGROUND OF THE INVENTION

1. Field of the Invention

The present invention relates to a photoresist composition. It also relates to a method of forming a photoresist pattern using the photoresist composition.

2. Description of the Related Art

Semiconductor devices are highly integrated and operate at a high speed. They have been required to form a very fine pattern having a line width which is no more than about 0.5 μm. Conventionally, a photolithography process using a photo-resistive material such as photoresist is typically utilized in forming a pattern for a semiconductor device he photolithography process generally includes a photoresist coating process, an aligning process, an exposing process and a developing process.

The molecular structure of the photoresist, which is changed by light irradiated thereto is coated on the substrate such as a silicon wafer. This forms a photoresist film on the substrate by the photoresist coating process. Then, a photo mask on which an electronic circuit pattern is formed is arranged over the wafer on which the photoresist film is formed during the aligning process. Then, an illuminating light which has a particular wavelength to which the photoresist film is particularly sensitive can be provided. In this way, photo chemical reactions will be incurred when illuminating light is irradiated onto the photo mask. Accordingly, a predetermined electronic circuit pattern can be transcribed onto the photoresist film by the aligning and exposing process. The molecular structures of the photoresist film are selectively changed in accordance with the predetermined electronic circuit pattern. The developing process selectively removes the photoresist film having the changed molecular structures to thereby forming a photoresist pattern on the substrate.

A minimal line width of the photoresist pattern or the semiconductor pattern is determined in accordance with a resolution of an exposing system. The resolution of the exposing system is determined by the wavelength of the illuminating light according to a Rayleigh's equation as follows.

$$R = K_1 \lambda / NA \quad (1)$$

In this Rayleigh's equation, $\lambda$ denotes a wavelength of the illuminating light of an exposing system, R denotes a resolution limit of an exposing system, $K_1$ denotes a proportional constant of an exposing process, and NA denotes a numerical aperture of a lens of an exposing process. According to the Rayleigh's equation (1), the wavelength $\lambda$ of the illuminating light and the proportional constant $K_1$ need to be as small as possible, and the numerical aperture of a lens needs to be as large as possible for decreasing the resolution limit of an exposing system. Thus, the higher the resolution of the exposing system, the shorter the wavelength of the illuminating light, and thus the wavelength of the illuminating light needs to be reduced in order to form a fine photoresist pattern. Among the factors of the Rayleigh's equation, the wavelength $\lambda$ of the illuminating light is most widely utilized for increasing the resolution limit of an exposing system.

In early 1980s, a G-line light having a wavelength of about 436 nm or an I-line light having a wavelength of about 365 nm were exemplarily used as the illuminating light, and the photoresist pattern was formed having a resolution of from about 350 to about 500 nm. Recently, a krypton fluoride (KrF) excimer laser having a wavelength of about 248 nm, or an argon fluoride (ArF) excimer laser having a wavelength of about 193 nm were used as the illuminating light, and a photoresist pattern has been formed having a resolution of about 180 to about 1240 nm. A recent memory device of a few giga-bytes is now possible to be manufactured having the above referenced fine photoresist pattern (as disclosed in Solid State Technology, January, 2000).

The fine photoresist pattern is influenced to a great extent by a wavelength of the illuminating light, and the exposition system including the illuminating light, and the resolution limit of the exposition system. Examples of a photoresist composition are disclosed in the articles entitled "Photoresist Materials and Processes", McGraw Hill Book Company, New York 1975, and "Semiconductor Lithography, Principles, Practices and Materials", Plenum Press, New York 1988.

Various factors such as the optical characteristics of a layer to be patterned, the standing wave caused by a thickness variation of a photoresist film, the light reflected from a reflective notch or the diffraction light diffracted from the layer to be patterned, have been widely known to have much effect on the exposing process for forming the super fine photoresist pattern. That is, those factors have much effect on the photoresist pattern to thereby generate various exposing failures such as the change in a critical dimension of the photoresist pattern and the increase of a surface area of the pattern.

In particular, when the KrF laser or the ArF laser is utilized for the illuminating light, the illuminating light has a high transmissivity with respect to a photoresist film on a substrate due to the wavelength and the strong energy of the laser, so that the photoresist pattern formed by using the KrF laser or ArF laser is much more influenced by the above-mentioned factors of the exposing process. That is, the exposing failures are generated more frequently when the photoresist pattern is formed using the KrF or ArF excimer laser.

Various researches have been conducted for solving the problems caused by the factors of the exposing process. For example, Japanese Patent Laid-Open Publication Nos. 1997-73173, 1997-90637 and 1998-161313 disclose photoresist compositions comprising a resin including an alkali-soluble group protected by a pendant alkali-soluble group that is transformed to be soluble by an alkali material, when the alkali-soluble group is dissociated therefrom by an acid.

In addition, Japanese Patent Laid-Open Publication No. 1999-202479 discloses a method of preventing the standing wave generated from a photoresist film using a photoresist material comprising a photo acid generator, a resin having a hydrocarbon structure that is dissolved by a photo acid generated from the photo acid generator which has a high solubility in an alkali developer, and an oligo alkylene glycol dialkyl ether compound.

Further, U.S. Pat. No. 6,200,728 discloses photoresist compositions comprising a photo acid generator mixture for generating various photo acids, having a different acid strength from each other. A fine photoresist pattern having a high resolution is formed on a boron phosphorus silicate glass using the same photoresist compositions.

However, when the ArF excimer laser is utilized for forming a fine photoresist pattern, there is a problem that a profile of the photoresist pattern is not satisfactory in accordance with a layer to be etched using the photoresist pattern, the thickness of the photoresist pattern, and the reduced design rule that is used by the above-disclosed method and photoresist compositions for the photoresist pattern.

SUMMARY OF THE INVENTION

Accordingly, the present invention provides a photoresist composition for preventing exposing failures even though the ArF or KrF excimer laser is utilized to thereby form a photoresist pattern having a good profile.

The present invention also provides a method of forming a pattern on a substrate using the subject photoresist composition. According to an exemplary embodiment of the present invention, there is provided a photoresist composition coated on an object to be patterned. The photoresist composition preferably comprises from about 0.1% to about 0.5% by weight of a photo acid generator (PAG), from about 2% to about 10% by weight of a polymer resin, and a residual of a solvent. The amount of the PAG is preferably in a range of from about 0.15% to about 0.4% by weight based on a total weight of the photoresist composition. The PAG preferably comprises a monophenyl sulfonium compound, a triphenyl sulfonium compound, or a mixture thereof.

In one embodiment, the photoresist composition comprises a weight ratio of the triphenyl sulfonium compound with respect to the monophenyl sulfonium compound which is in a range of from about 2.5 to about 3.5 in the mixture of the monophenyl sulfonium compound and the triphenyl sulfonium compound. In another embodiment, the weight ratio of the triphenyl sulfonium compound with respect to the monophenyl sulfonium compound is in a range of from about 5.5 to about 6.5 in the mixture of the monophenyl sulfonium compound and the triphenyl sulfonium compound.

The polymer resin preferably comprises an acrylate, a methacrylate or an olefin.

The object can comprise a silicon substrate on which an anti-reflection layer is formed. The object can also comprise a polysilicon layer on which an anti-reflection layer is formed.

A method of forming a pattern is also provided. The method preferably comprises providing a photoresist composition comprising from about 0.1% to about 0.5% by weight of a PAG, from about 2% to about 10% by weight of a polymer resin, and a residual of a solvent, the PAG comprising monophenyl sulfonium compound, triphenyl sulfonium compound, or a mixture thereof; coating the photoresist composition onto an object and thereby forming a photoresist film; selectively exposing the photoresist film using an illuminating light; and developing the selectively exposed photoresist film thereby forming a photoresist pattern.

According to an aspect of the present invention, the footing phenomenon and the top loss of a pattern are sufficiently prevented. In addition, although the ArF excimer laser is utilized as a light source of an exposing system, a poor profile of a photoresist pattern due to a standing wave is remarkably prevented.

BRIEF DESCRIPTION OF THE DRAWINGS

The above and other features and advantages of the present invention will become readily apparent by reference to the following detailed description when considering in conjunction with the accompanying drawings, in which.

DETAILED DESCRIPTION OF THE PREFERRED EMBODIMENTS

Figure 1:
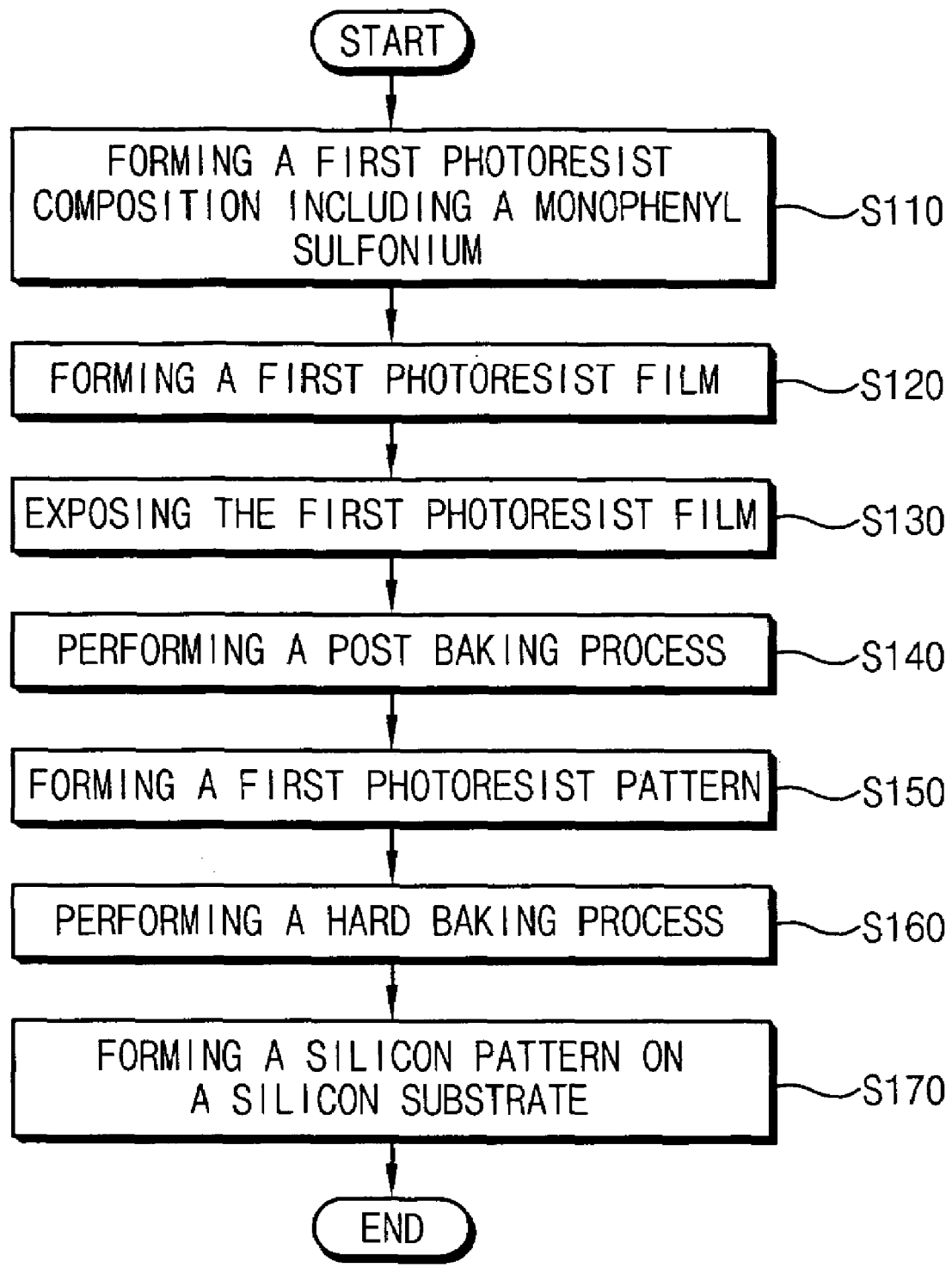
FIG. 1 is a flow chart illustrating a method of forming a silicon pattern using the photoresist compositions according to an exemplarily embodiment of the present invention.

The present invention now will be described more fully hereinafter with reference to the accompanying drawings in which exemplary embodiments of the present invention are shown.

Photoresist Composition

A photoresist composition of the present invention is a type of a photosensitive polymer that is coated on an object to be patterned. It preferably includes a photo acid generator (PAG) selectively sensitive to a particular light which generates a photo acid, a polymer resin having a molecular structure which is changed by the photo acid, and a residual of a solvent. A composition ratio and kind of the PAG may be varied in accordance with the object onto which the photoresist composition is coated.

When the amount of the PAG is less than about 0.1% by weight, based on a total weight of the photoresist composition, the photo acid, according to the Arrhenius theory, generates less hydrogen ions during the exposing process. Thus, a light reflected from the object on which the photoresist composition is coated is less effective in facilitating the exposing process. Conversely, when the amount of the PAG is more than about 0.5% by weight, based on a total weight of the photoresist composition, an excessive amount of the photo acid is generated during the exposing process. Thus, a top portion of the photoresist pattern is broken away during the developing process (hereinafter referred to as top loss of a pattern). Accordingly, the photoresist composition preferably includes from about 0.1% to about 0.5% by weight of the PAG, and more preferably, includes about 0.15% to about 0.4% by weight of the PAG.

Absorbance and reflectivity of light differ in accordance with the object. Examples of the object include a silicon substrate, an insulation layer, a polysilicon layer and an amorphous silicon carbide layer, each of which can include an anti-reflection layer formed thereon. An example of the insulation layer is a layer based on silicon oxide, such as a boron phosphorus silicate glass (BPSG) layer. The polysilicon layer may be doped with impurities.

In the present invention, the PAG includes a monophenyl sulfonium compound, a triphenyl sulfonium compound, or a mixture thereof. Examples of the monophenyl sulfonium compound include triphenyl sulfonium triflate, triphenyl sulfonium nonaflate, a triphenyl sulfonium perfluorooctanesulfonate, etc.

The monophenyl sulfonium compound has a higher transmissivity and a smaller quantum yield as compared with the triphenyl sulfonium compound. That is, the monophenyl sulfonium compound has small absorbance and acid generation rate as compared with the triphenyl sulfonium compound.

The photoresist composition including the above-mentioned PAG includes about 2% to about 10% by weight of a polymer resin, and a residual of a solvent.

Examples of the polymer resin include an acrylate-based resin, a cyclo-olefin methacrylate (COMA)-based resin, a cyclo-olefin (CO)-based resin, etc. More preferably, the polymer resin includes a methacrylate resin, a vinyl ether methacrylate (VEMA) resin, a COMA resin, etc. These can be used alone or in a combination thereof.

Examples of the solvent include propylene glycol monomethyl ether (PGMEA), methyl 2-hydroxyisobutyrate (HBM), ethyl lactate (EL), cyclohexanone, heptanone, lactone, etc. These can be used alone or in a mixture thereof.

The polymer resin is not limited within the above exemplary materials, and in further, any materials can be selected as the polymer resin on condition that the selected material is not reacted with the solvent and has a sufficient solubility and evaporation rate such that a uniform and plain deposition layer is formed on a substrate after the solvent is fully evaporated.

Photoresist Composition for Forming a Silicon Pattern

When a photoresist film for patterning a silicon substrate is formed on the silicon substrate on which an anti-reflection layer is formed, a photoresist composition for the photoresist film comprises from about 0.1% to about 0.5% by weight of a PAG, from about 2% to about 10% by weight of a polymer resin, and a residual of a solvent. More preferably, the photoresist composition comprises from about 0.15% to about 0.4% by weight of the PAG based on a total weight of the photoresist composition.

When the photoresist compositions are coated on the silicon substrate, the light reflectivity of the substrate is smaller than that of the polysilicon layer. Accordingly, the monophenyl sulfonium compound is most preferable as the PAG since the amount of acid employed for reducing the light reflected from the silicon substrate is less. Then, the photoresist film including the monophenyl sulfonium compound is exposed to an illuminating light having a preferred wavelength of not more than about 193 nm, and is developed to form a photoresist pattern on the silicon substrate. The photoresist pattern on the anti-reflection layer has a profile substantially vertical to the top surface of the substrate and has no top loss of the photoresist pattern. In addition, no residual photoresist compositions remain on the bottom surface of the photoresist pattern after completing the photoresist pattern. Hereinafter, the remaining residual photoresist composition on the bottom surface of the photoresist pattern is referred to as footing phenomenon.

Photoresist Compositions for Forming an Insulation Pattern

When a photoresist film for patterning an insulation layer is formed on the silicon substrate on which an anti-reflection layer and an insulation layer are sequentially formed, a photoresist composition for the photoresist film can comprise from about 0.1% to about 0.5% by weight of a PAG, from about 2% to about 10% by weight of a polymer resin, and a residual of a solvent. More preferably, the photoresist composition can comprise from about 0.15% to about 0.4% by weight of the PAG, based on a total weight of the photoresist composition.

When the photoresist compositions are coated on the insulation layer, the light reflectivity of the insulation layer can be greater than that of the silicon substrate. Accordingly, the triphenyl sulfonium compound is most preferable as the PAG since more acid for reducing a light reflected from the insulation layer is required. Then, the photoresist film including the triphenyl sulfonium compound is exposed to an illuminating light having a preferred wavelength of not more than about 193 nm and is developed to form a photoresist pattern on the insulation layer. The photoresist pattern on the insulation layer has a profile substantially vertical to a top surface of the insulation layer and has no top loss of the photoresist pattern. In addition, the footing phenomenon is substantially prevented, and no residual photoresist compositions remain on the bottom surface of the photoresist pattern after completing the photoresist pattern.

Photoresist Compositions for Forming a Polysilicon Pattern

When a photoresist film for patterning a polysilicon layer is formed on the silicon substrate on which an anti-reflection layer and a polysilicon layer are sequentially formed, a preferred photoresist composition for the photoresist film comprises from about 0.1% to about 0.5% by weight of a PAG, from about 2% to about 10% by weight of a polymer resin, and a residual of a solvent.

In the present embodiment, the PAG comprises a first mixture of the monophenyl sulfonium compound and the triphenyl sulfonium compound, and a weight ratio of the triphenyl sulfonium compound with respect to the monophenyl sulfonium compound of preferably from about 2.5 to about 3.5, and is most preferable about 3. When the weight ratio of the triphenyl sulfonium compound with respect to the monophenyl sulfonium compound is less than about 2.5, the light reflectivity of the polysilicon layer is low and the acid employed for reducing a reflection light reflected from the polysilicon layer is reduced. Thus, the footing phenomenon is generated on a bottom portion of the photoresist pattern. In addition, when the weight ratio of the triphenyl sulfonium compound with respect to the monophenyl sulfonium compound is more than about 3.5, excess acid for reducing the reflection light is generated, and the top portion of the photoresist pattern is broken off.

When the photoresist compositions are coated on the polysilicon layer, the light reflectivity of the polysilicon layer can be greater than that of the silicon substrate and less than that of the insulation layer. Accordingly, in the first mixture of the present invention, the triphenyl sulfonium compound can be more included than the monophenyl sulfonium compound in the photoresist compositions since more acid for reducing the light reflected from the polysilicon layer is generated from the triphenyl sulfonium compound than the monophenyl sulfonium compound. Then, the photoresist film including the first mixture can be exposed to an illuminating light having a wavelength not more than about 193 nm and can be developed to form a photoresist pattern on the polysilicon layer. The photoresist pattern on the polysilicon layer has a profile which is substantially vertical to a top surface of the polysilicon layer and has no top loss of the photoresist pattern. In addition, the footing phenomenon is not generated, and no residual photoresist compositions remains on the bottom surface of the photoresist pattern after completing the photoresist pattern.

Photoresist Compositions for Forming an Amorphous Silicon Carbide Pattern

When a photoresist film for patterning a silicon carbide layer is formed on the silicon substrate on which an anti-reflection layer and a silicon carbide layer are sequentially formed, a photoresist composition for the photoresist film can comprise from about 0.1% to about 0.5% by weight of a PAG, from about 2% to about 10% by weight of a polymer resin, and a residual of a solvent.

In the present embodiment, the PAG can be a second mixture of the monophenyl sulfonium compound and the triphenyl sulfonium compound, and a preferred weight ratio of the triphenyl sulfonium compound with respect to the monophenyl sulfonium compound of about 5.5 to about 6.5. When the weight ratio of the triphenyl sulfonium compound with respect to the monophenyl sulfonium compound is less than about 5.5, the light reflectivity of the silicon carbide layer is low and the amount of acid for reducing a light reflected from the polysilicon layer is reduced. Thus, the footing phenomenon is generated on a bottom portion of the photoresist pattern. In addition, when the weight ratio of the triphenyl sulfonium compound with respect to the monophenyl sulfonium compound is more than about 6.5, the amount of acid generated for reducing the reflection light is excessive, and a top portion of the photoresist pattern is broken off. Accordingly, the weight ratio of the triphenyl sulfonium compound with respect to the monophenyl sulfonium compound is preferable between about 5.5 to about 6.5, and is most preferable about 6.0.

Hereinafter, a method of forming a pattern having a line width no more than about 90 nm using the above-described photoresist compositions will be fully described. In the present embodiment, the silicon pattern, the polysilicon pattern and the amorphous silicon carbide pattern will be specifically described below. However, the present invention should not be limited to these exemplary methods of forming the above-mentioned patterns.

Referring to FIG. 1, a first photoresist composition preferably comprises from about 0.1% to about 0.5% by weight of a PAG, from about 2% to about 10% by weight of a polymer resin, and a residual of a solvent, and the PAG includes monophenyl sulfonium compound (step S110). The first photoresist composition is described above, thus further description of the first photoresist compositions is omitted.

Then, the first photoresist composition is coated on a silicon substrate on which an anti-reflection layer is formed, and a soft baking process is performed on the substrate to form a first photoresist film (step S120). The soft baking process is performed on the first photoresist film for reinforcing adhesion of the first photoresist compositions to the substrate at a temperature of about 110° C. to about 120° C.

A reticle on which a mask pattern is formed in accordance with an electronic circuit is positioned over the first photoresist film, and an illuminating light is irradiated onto the reticle. The illuminating light passes through the reticle in accordance with the mask pattern, and is projected onto the first photoresist film. Accordingly, the first photoresist film is selectively exposed to the illuminating light in accordance with the mask pattern (step S130), so that the electronic circuit is transferred and down-sized onto the first photoresist film in a predetermined reduction ratio.

The first photoresist composition is preferably sensitive to illuminating light having a wavelength of no more than about 248 nm. In the present embodiment, the first photoresist composition is most sensitive to illuminating light having a wavelength of not more than about 193 nm, such as an ArF excimer laser. However, the illuminating light should not be limited to the ArF excimer laser, and may have other light source having a wavelength different from that of the ArF excimer laser in consideration of processing conditions.

A post baking process is performed on the substrate including the first photoresist film (step S140), and the exposed first photoresist film is developed using a conventional developing process. The post baking process is performed for reducing residual solvent remaining in the first photoresist film. The exposed portion of the first photoresist film is dissolved using a developing solution having high solubility with respect to the exposed first photoresist film. Thus, the exposed portion of the first photoresist film is removed from the substrate to form a first photoresist pattern on the substrate (step S150). A cleaning process for removing residual developing solution remaining on the substrate may be further performed.

The first photoresist pattern on the substrate has a profile substantially vertical to a top surface of the silicon substrate since a standing wave is not generated therefrom. The footing phenomenon is not generated at a bottom portion of the first photoresist pattern, and thus no residual photoresist compositions remain on the bottom surface of the first photoresist pattern after completing the first photoresist pattern. Further, no top loss of the pattern is generated at a top portion of the first photoresist pattern, so that the first photoresist pattern functions as a good etching mask for patterning the silicon substrate.

A hard baking process is performed on the substrate including the first photoresist pattern (step S160), and a portion of the anti-reflection layer and a top portion of the silicon substrate, which are exposed through the first photoresist pattern, are partially removed by a dry etching process using the first photoresist pattern as an etching mask to thereby form a silicon pattern on the silicon substrate (step S170). Then, a residual photoresist pattern and the anti-reflection layer remaining on the substrate are removed after completing the dry etching process for the silicon pattern.

Figure 2:
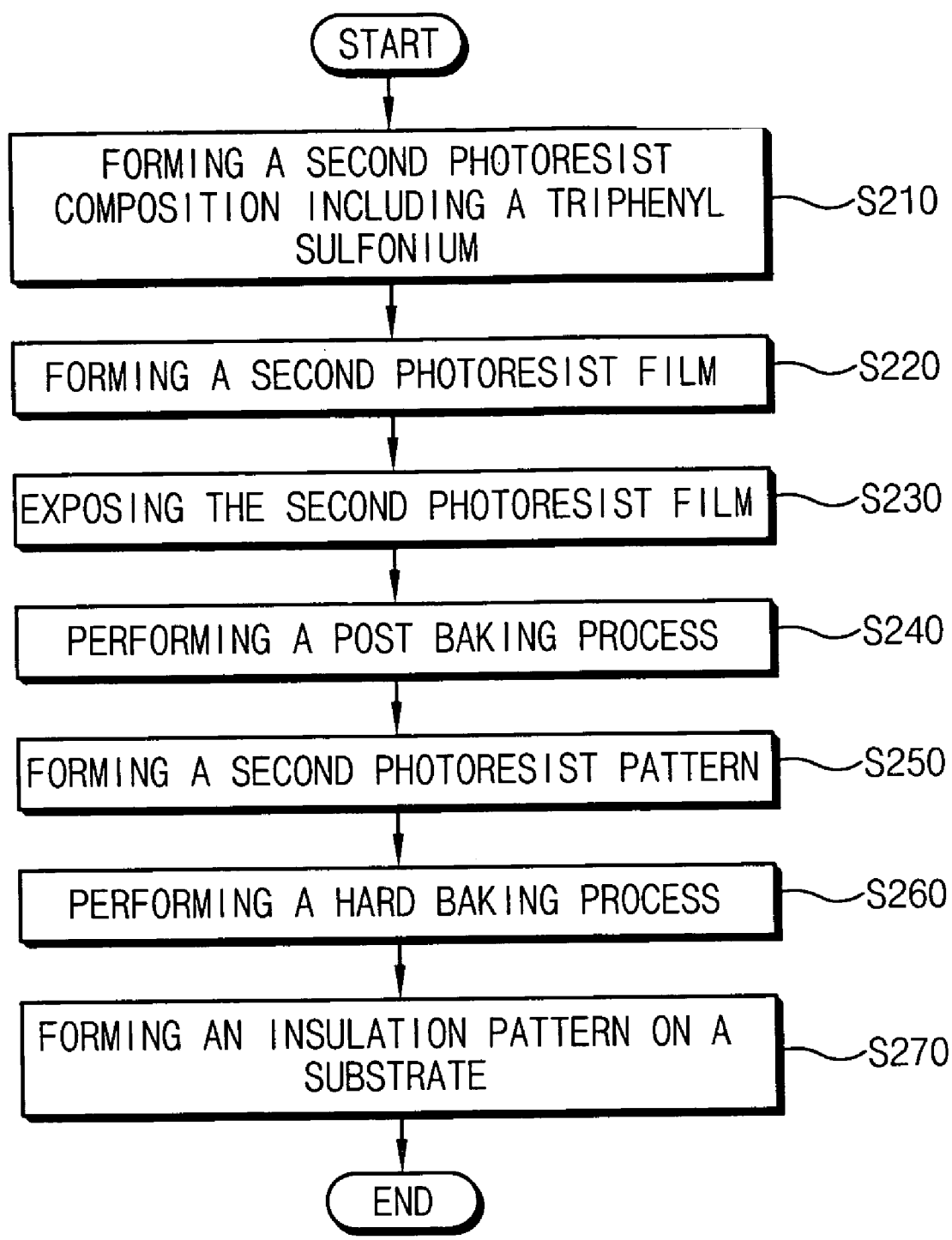
FIG. 2 is a flow chart illustrating a method of forming an insulation pattern using the photoresist compositions according to an exemplarily embodiment of the present invention.

Referring to FIG. 2, a second photoresist composition is prepared preferably comprising from about 0.1% to about 0.5% by weight of a PAG, from about 2% to about 10% by weight of a polymer resin, and a residual of a solvent. The PAG includes triphenyl sulfonium compound (step S210). The second photoresist composition is fully described above, thus further description on the second photoresist compositions is omitted.

Then, the second photoresist compositions are coated on a silicon substrate on which an anti-reflection layer and an insulation layer are sequentially formed, and a soft baking process is performed on the substrate to form a second photoresist film (step S220). The soft baking process is performed on the second photoresist film for reinforcing adhesion of the second photoresist compositions with the substrate at a temperature of about 110° C. to about 120° C. An example of the insulation layer is boron phosphorus silicate glass (BPSG) layer.

A reticle on which a mask pattern is formed in accordance with an electronic circuit is positioned over the second photoresist film, and an illuminating light is irradiated onto the reticle. The illuminating light passes through the reticle in accordance with the mask pattern, and is projected to the second photoresist film. Accordingly, the second photoresist film is selectively exposed to the illuminating light in accordance with the mask pattern (step S230), so that the electronic circuit is transferred and down-sized onto the second photoresist film in a predetermined reduction ratio.

The second photoresist composition is preferably sensitive to the illuminating light having a wavelength less than about 240 nm. In the present embodiment, the second photoresist composition is most sensitive to the illuminating light having a wavelength of not more than about 193 nm such as an ArF excimer laser. However, the illuminating light should not be limited to the ArF excimer laser, and it may have other light sources having a wavelength different from that of the ArF excimer laser in consideration of processing conditions.

A post baking process is performed on the substrate including the second photoresist film (step S240), and the exposed second photoresist film is developed using a conventional developing process. The post baking process is performed for reducing residual solvent remaining in the second photoresist film. The exposed portion of the second photoresist film is dissolved using a developing solution having high solubility with respect to the exposed second photoresist film. Thus, the exposed portion of the second photoresist film is removed from the insulation layer forming a second photoresist pattern on the insulation layer (step S250). A cleaning process for removing residual developing solution remaining on the insulation layer may be further employed.

The second photoresist pattern on the insulation layer has a profile substantially vertical to a top surface of the insulation layer since a standing wave is not generated therefrom. The footing phenomenon is not generated at a bottom portion of the second photoresist pattern, and thus no residual photoresist compositions remain on the bottom surface of the second photoresist pattern after completing the second photoresist pattern. Further, top loss of a pattern is not generated at a top portion of the second photoresist pattern, so that the second photoresist pattern functions as a good etching mask for patterning the insulation layer.

A hard baking process is performed on the substrate including the second photoresist pattern (step S260), and a portion of the anti-reflection layer and a portion of the insulation layer, which are exposed through the second photoresist pattern, are partially removed by a dry etching process using the second photoresist pattern as an etching mask to form an insulation pattern on the substrate (step S270). Then, a residual photoresist pattern and a residual anti-reflection layer remaining on the substrate are removed after completing the dry etching process for the insulation pattern.

Figure 3:
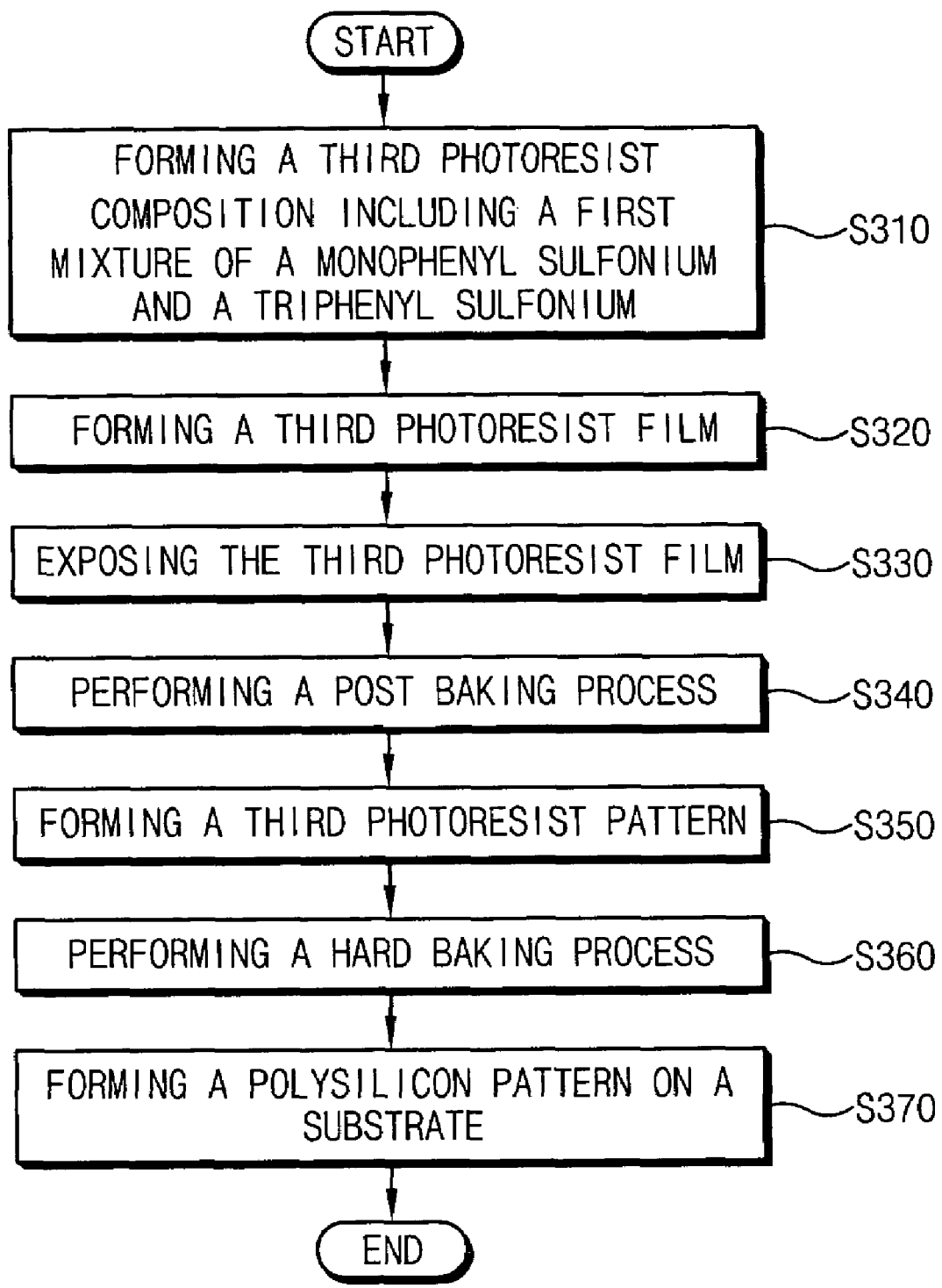
FIG. 3 is a flow chart illustrating a method of forming a polysilicon pattern using the photoresist compositions according to an exemplarily embodiment of the present invention.

Referring to FIG. 3, a third photoresist composition can be prepared comprising from about 0.1% to about 0.5% by weight of a PAG, from about 2% to about 10% by weight of a polymer resin, and a residual of a solvent, the PAG including a first mixture of a monotriphenyl sulfonium compound and a triphenyl sulfonium compound (step S310). The first mixture has a weight ratio of the triphenyl sulfonium compound to monophenyl sulfonium compound in a preferred range of about 2.5 to about 3.5. The third photoresist composition is sufficiently described above, thus further description of the third photoresist composition is omitted.

Then, the third photoresist compositions are coated on a silicon substrate on which an anti-reflection layer and a polysilicon layer are sequentially formed, and a soft baking process is performed on the substrate to form a third photoresist film (step S320).

A reticle is positioned over a mask pattern in the form of an electronic circuit on the third photoresist film, and an illuminating light is irradiated onto the reticle. The illuminating light passes through the reticle in accordance with the mask pattern, and is projected onto the third photoresist film. Accordingly, the third photoresist film is selectively exposed to the illuminating light in accordance with the mask pattern (step S330), so that the electronic circuit is transferred and down-sized onto the third photoresist film having a predetermined reduction ratio.

In the present invention, the third photoresist composition is most sensitive to the illuminating light having a wavelength of not more than about 193 nm such as an ArF excimer laser. However, the illuminating light should not be limited to the ArF excimer laser, and may have other light source having a wavelength different from that of the ArF excimer laser in consideration of processing conditions.

A post baking process is performed on the substrate including the third photoresist film (step S340), and the exposed third photoresist film is developed using a conventional developing process. The post baking process is performed for reducing residual solvent remaining in the third photoresist film. The exposed portion of the third photoresist film is dissolved with a developing solution having high solubility with respect to the exposed third photoresist film. Thus, the exposed portion of the third photoresist film is removed from the polysilicon layer forming a third photoresist pattern on the polysilicon layer (step S350). A cleaning process for removing a residual developing solution remaining on the polysilicon layer may be further employed.

The third photoresist pattern on the polysilicon layer has a profile substantially vertical to a top surface of the polysilicon layer since a standing wave is not generated therefrom. The footing phenomenon is not generated at a bottom portion of the third photoresist pattern, and thus no residual photoresist compositions remain on the bottom surface of the third photoresist pattern after completing the third photoresist pattern. Further, top loss of a pattern is not generated at a top portion of the third photoresist pattern, so that the third photoresist pattern functions as a good etching mask for patterning the polysilicon layer.

A hard baking process is performed on the substrate including the third photoresist pattern (step S360), and a portion of the anti-reflection layer and a portion of the polysilicon layer, which are exposed through the third photoresist pattern, are partially removed by a dry etching process using the third photoresist pattern as an etching mask to form a polysilicon pattern on the substrate (step S370). Then, a residual photoresist pattern and a residual anti-reflection layer remaining on the substrate are removed after completing the dry etching process for the polysilicon pattern.

Figure 4:
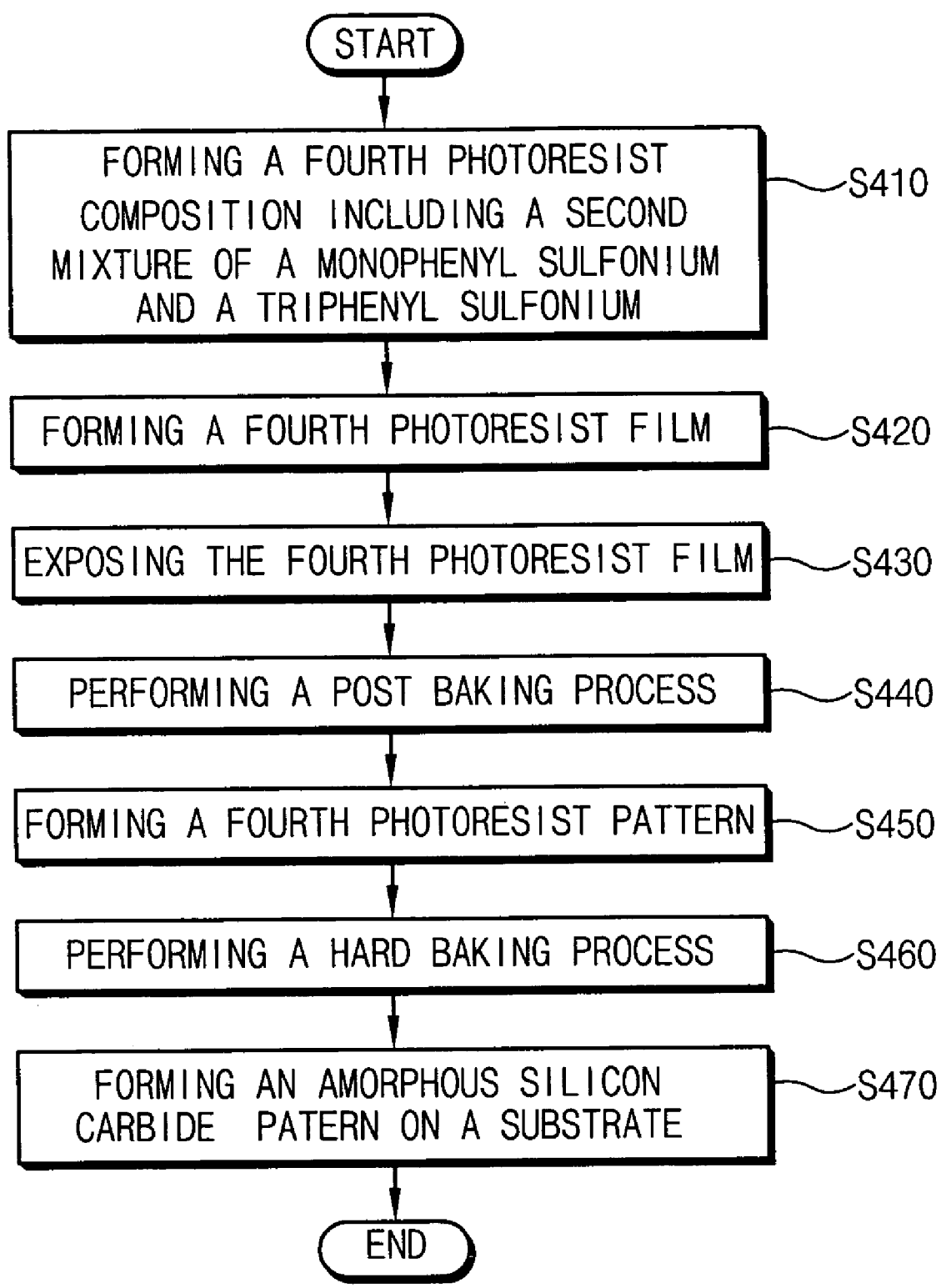
FIG. 4 is a flow chart illustrating a method of forming an amorphous silicon carbide pattern using the photoresist compositions according to an exemplarily embodiment of the present invention.

Referring to FIG. 4, a fourth photoresist composition can be prepared comprising from about 0.1% to about 0.5% by weight of a PAG, from about 2% to about 10% by weight of a polymer resin, and a residual of a solvent, and the PAG includes a second mixture of a monotriphenyl sulfonium compound and a triphenyl sulfonium compound (step S410).

The first mixture has a weight ratio of the triphenyl sulfonium compound with respect to the monophenyl sulfonium compound in a preferred range of about 5.5 to about 6.5. The fourth photoresist composition is fully described above, thus further description of the fourth photoresist composition is omitted.

Then, the fourth photoresist compositions are coated onto a silicon substrate on which an anti-reflection layer and an amorphous silicon carbide layer are sequentially formed, and a soft baking process is performed on the substrate to thereby form a fourth photoresist film (step S420).

A reticle is positioned over a mask pattern in the form of an electronic circuit on the third photoresist film, and an illuminating light is irradiated onto the reticle. The illuminating light passes through the reticle in accordance with the mask pattern, and is projected onto the third photoresist film. Accordingly, the fourth photoresist film is selectively exposed to the illuminating light in accordance with the mask pattern (step S430), so that the electronic circuit is transferred and down-sized onto the fourth photoresist film in a predetermined reduction ratio.

In the present invention, the fourth photoresist composition is most sensitive to illuminating light having a wavelength not more than about 193 nm, such as an ArF excimer laser. However, the illuminating light should not be limited to the ArF excimer laser, and may have other light source having a wavelength different from that of the ArF excimer laser in consideration of processing conditions.

A post baking process is performed on the substrate including the fourth photoresist film (step S440), and the exposed fourth photoresist film is developed using a conventional developing process. The post baking process is performed for reducing residual solvent remaining in the fourth photoresist film. The exposed portion of the fourth photoresist film is dissolved using a developing solution having high solubility with respect to the exposed fourth photoresist film, and thus the exposed portion of the fourth photoresist film is removed from the polysilicon layer to thereby form a fourth photoresist pattern on the amorphous silicon carbide layer (step S450). A cleaning process for removing a residual developing solution remaining on the amorphous silicon carbide layer may be further employed.

The fourth photoresist pattern on the amorphous silicon carbide layer has a profile substantially vertical to a top surface of the amorphous silicon carbide layer since a standing wave is not generated therefrom. The footing phenomenon is not generated at a bottom portion of the fourth photoresist pattern, and thus no residual photoresist compositions remain on the bottom surface of the fourth photoresist pattern after completing the fourth photoresist pattern. Further, top loss of a pattern is not generated at a top portion of the fourth photoresist pattern, so that the fourth photoresist pattern functions as a good etching mask for patterning the amorphous silicon carbide layer.

A hard baking process is performed on the substrate including the fourth photoresist pattern (step S460), and a portion of the anti-reflection layer and a portion of the amorphous silicon carbide layer, which are exposed through the fourth photoresist pattern, are partially removed by a dry etching process using the fourth photoresist pattern as an etching mask to form an amorphous silicon carbide pattern on the substrate (step S470). Then, a residual photoresist pattern and a residual anti-reflection layer remaining on the substrate are removed after completing the dry etching process for the amorphous silicon carbide pattern.

Hereinafter, various examples and comparative examples are provided for describing the present invention in more detail. The various examples provided below are exemplary examples of the present invention. Thus, the present invention should not be limited by these exemplary examples.

EXAMPLE 1

A methacrylate resin of about 50 weight parts, a quencher of about 10 weight parts, a PAG of about 25 weight parts and a solvent of about 915 weight parts were mixed with one another to thereby form a first solution. The PAG comprised a monophenyl sulfonium. The first solution was filtered through a membrane filter of about 0.2 μm, to thereby obtain a first photoresist composition that was coated on a silicon substrate including an anti-reflection layer and sensitive to an ArF excimer laser.

EXAMPLE 2

A methacrylate resin of about 50 weight parts, a quencher of about 10 weight parts, a PAG of about 25 weight parts and a solvent of about 915 weight parts were mixed with one another to thereby form a second solution. The PAG comprised a triphenyl sulfonium. The second solution was filtered through a membrane filter of about 0.21 μm, to thereby obtain a second photoresist composition that was coated on a BPSG layer and sensitive to an ArF excimer laser. The BPSG layer was formed on a silicon substrate including the anti-reflection layer.

EXAMPLE 3

A methacrylate resin of about 50 weight parts, a quencher of about 10 weight parts, a PAG of about 25 weight parts and a solvent of about 915 weight parts were mixed with one another to thereby form a third solution. The PAG comprised a first mixture of a monophenyl sulfonium and a triphenyl sulfonium. A weight ratio between the monophenyl sulfonium and the triphenyl sulfonium was about 1:3 in the first mixture. The third solution was filtered through a membrane filter of about 0.2 μm, to thereby obtain a third photoresist composition that was coated on a polysilicon layer and sensitive to an ArF excimer laser. The polysilicon layer was formed on a silicon substrate including the anti-reflection layer.

EXAMPLE 4

A methacrylate resin of about 50 weight parts, a quencher of about 10 weight parts, a PAG of about 25 weight parts and a solvent of about 915 weight parts were mixed with one another to thereby form a fourth solution. The PAG comprised a second mixture of a monophenyl sulfonium and a triphenyl sulfonium. A weight ratio between the monophenyl sulfonium and the triphenyl sulfonium was about 1:6 in the second mixture. The fourth solution was filtered through a membrane filter of about 0.2 μm, to thereby obtain a fourth photoresist composition that was coated on an amorphous silicon carbide layer and sensitive to an ArF excimer laser. The amorphous silicon carbide layer was formed on a silicon substrate including the anti-reflection layer.

COMPARATIVE EXAMPLE 1

A methacrylate resin of about 50 weight parts, a quencher of about 10 weight parts, a PAG of about 25 weight parts and a solvent of about 915 weight parts were mixed with one another to thereby form a first comparative solution. The PAG comprised a monophenyl sulfonium. The first comparative solution was filtered through a membrane filter of about 0.2 µm, to thereby obtain a first comparative photoresist composition that was coated on a BPSG layer and sensitive to an ArF excimer laser. The BPSG layer was formed on a silicon substrate including the anti-reflection layer.

COMPARATIVE EXAMPLE 2

A methacrylate resin of about 50 weight parts, a quencher of about 10 weight parts, a PAG of about 25 weight parts and a solvent of about 915 weight parts were mixed with one another to thereby form a second comparative solution. The PAG comprised a first comparative mixture of a monophenyl sulfonium and a triphenyl sulfonium. A weight ratio between the monophenyl sulfonium and the triphenyl sulfonium was about 62.5:37.5 in the first comparative mixture. The second comparative solution was filtered through a membrane filter of about 0.2 µm, to thereby obtain a second comparative photoresist composition that was coated on a BPSG layer and sensitive to an ArF excimer laser. The BPSG layer was formed on a silicon substrate including the anti-reflection layer.

COMPARATIVE EXAMPLE 3

A methacrylate resin of about 50 weight parts, a quencher of about 10 weight parts, a PAG of about 25 weight parts and a solvent of about 915 weight parts were mixed with one another to thereby form a third comparative solution. The PAG comprised a second comparative mixture of a monophenyl sulfonium and a triphenyl sulfonium. A weight ratio between the monophenyl sulfonium and the triphenyl sulfonium was about 37.5:62.5 in the second comparative mixture. The third comparative solution was filtered through a membrane filter of about 0.2 µm, to thereby obtain a third comparative photoresist composition that was coated on a BPSG layer and sensitive to an ArF excimer laser. The BPSG layer was formed on a silicon substrate including the anti-reflection layer.

COMPARATIVE EXAMPLE 4

A methacrylate resin of about 50 weight parts, a quencher of about 10 weight parts, a PAG of about 25 weight parts and a solvent of about 915 weight parts were mixed with one another to thereby form a fourth comparative solution. The PAG comprised a third comparative mixture of a monophenyl sulfonium and a triphenyl sulfonium. A weight ratio between the monophenyl sulfonium and the triphenyl sulfonium was about 34.1:65.9 in the third comparative mixture. The fourth comparative solution was filtered through a membrane filter of about 0.2 µm, to thereby obtain a fourth comparative photoresist composition that was coated on a BPSG layer and sensitive to an ArF excimer laser. The BPSG layer was formed on a silicon substrate including the anti-reflection layer.

EXPERIMENT 1

The first photoresist composition was coated on a silicon substrate on which an anti-reflection layer was formed, and a baking process was performed on the substrate to thereby form a first photoresist film to a thickness of about 800 Å. Then, a ArF excimer laser was projected to the first photoresist film through a reticle positioned over the first photoresist film including a mask pattern. Accordingly, the first photoresist film was selectively exposed to the ArF excimer laser in accordance with the mask pattern. A soft baking process, a developing process and a hard baking process were sequentially performed on the exposed first photoresist film to thereby form a first photoresist pattern. Then, the first photoresist pattern was observed using an electron microscope, and a picture of a vertical profile of the first photoresist pattern was obtained.

Figure 5:
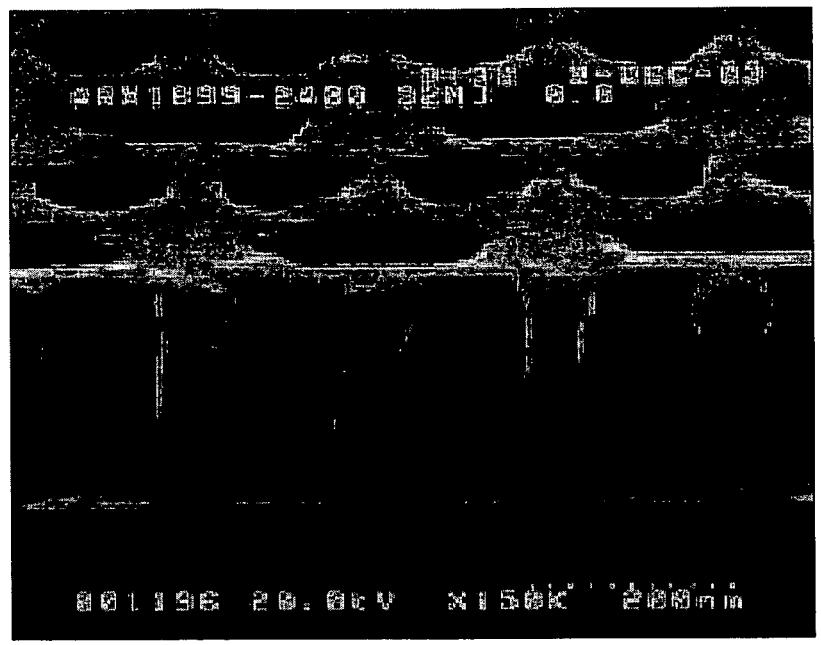
FIG. 5 is a scanning electron microscope (SEM) picture of a vertical profile of the first photoresist pattern.

FIG. 5 is a scanning electron microscope (SEM) picture of a vertical profile of the first photoresist pattern. As shown in FIG. 5, the first photoresist pattern on the substrate had a profile substantially vertical to a top surface of the substrate layer since a standing wave was not generated therefrom. The footing phenomenon was not observed at a bottom portion of the first photoresist pattern, and thus no residual photoresist compositions remained on the bottom surface of the first photoresist pattern. Further, a top portion of first photoresist pattern was not broken away.

EXPERIMENT 2

The second photoresist composition was coated on a silicon substrate on which an anti-reflection layer and a BPSG layer were sequentially formed, and a baking process was performed on the substrate to form a second photoresist film at a thickness of about 800 Å. Then, the ArF excimer laser was projected onto the second photoresist film through a reticle positioned over the second photoresist film including a mask pattern. Next, the second photoresist film was selectively exposed to the ArF excimer laser in accordance with the mask pattern. A soft baking process, a developing process and a hard baking process were sequentially performed on the exposed second photoresist film to thereby form a second photoresist pattern. Then, the second photoresist pattern was observed using an electron microscope, and a picture of a vertical profile of the second photoresist pattern was obtained.

Figure 6:
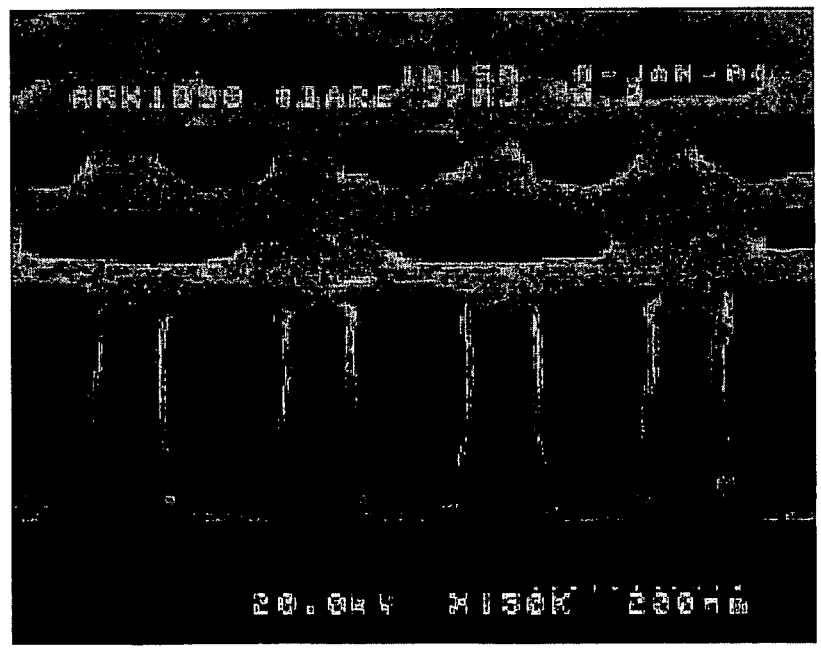
FIG. 6 is a SEM picture of a vertical profile of the second photoresist pattern.

FIG. 6 is a SEM picture of a vertical profile of the second photoresist pattern. As shown in FIG. 6, the second photoresist pattern on the BPSG layer had a profile substantially vertical to a top surface of the BPSG layer since a standing wave was not generated therefrom. The footing phenomenon was not observed at a bottom portion of the second photoresist pattern, and thus no residual photoresist compositions remained on the bottom surface of the second photoresist pattern. Further, a top portion of second photoresist pattern was not broken away.

EXPERIMENT 3

The third photoresist composition was coated on a silicon substrate on which an anti-reflection layer and a polysilicon layer were sequentially formed, and a baking process was performed on the substrate to thereby form a third photoresist film at a thickness of about 800 Å. Then, the ArF excimer laser was projected to the third photoresist film through a reticle positioned over the third photoresist film and including a mask pattern. Next, the third photoresist film was selectively exposed to the ArF excimer laser in accordance with the mask pattern. A soft baking process, a developing process and a hard baking process were sequentially performed on the exposed third photoresist film to form a third photoresist pattern. Then, the third photoresist pattern was observed using an electron microscope, and a picture of a vertical profile of the third photoresist pattern was obtained.

Figure 7:
FIG. 7 is a SEM picture of a vertical profile of the third photoresist pattern.

FIG. 7 is a SEM picture of a vertical profile of the third photoresist pattern. As shown in FIG. 7, the third photoresist pattern on the polysilicon layer had a profile substantially vertical to a top surface of the polysilicon layer since a standing wave was not generated therefrom. The footing phenomenon was not observed at a bottom portion of the third photoresist pattern, and thus no residual photoresist compositions remained on the bottom surface of the third photoresist pattern. Further, a top portion of third photoresist pattern was not broken away.

EXPERIMENT 4

The fourth photoresist composition was coated on a silicon substrate on which an anti-reflection layer and an amorphous silicon carbide layer were sequentially formed, and a baking process was performed on the substrate to thereby form a fourth photoresist film to a thickness of about 800 Å. Then, the ArF excimer laser was projected to the fourth photoresist film through a reticle positioned over the fourth photoresist film including a mask pattern. Next, the fourth photoresist film was selectively exposed to the ArF excimer laser in accordance with the mask pattern. A soft baking process, a developing process and a hard baking process were sequentially performed on the exposed fourth photoresist film to thereby form a fourth photoresist pattern. Then, the fourth photoresist pattern was observed using an electron microscope, and a picture of a vertical profile of the fourth photoresist pattern was obtained.

Figure 8:
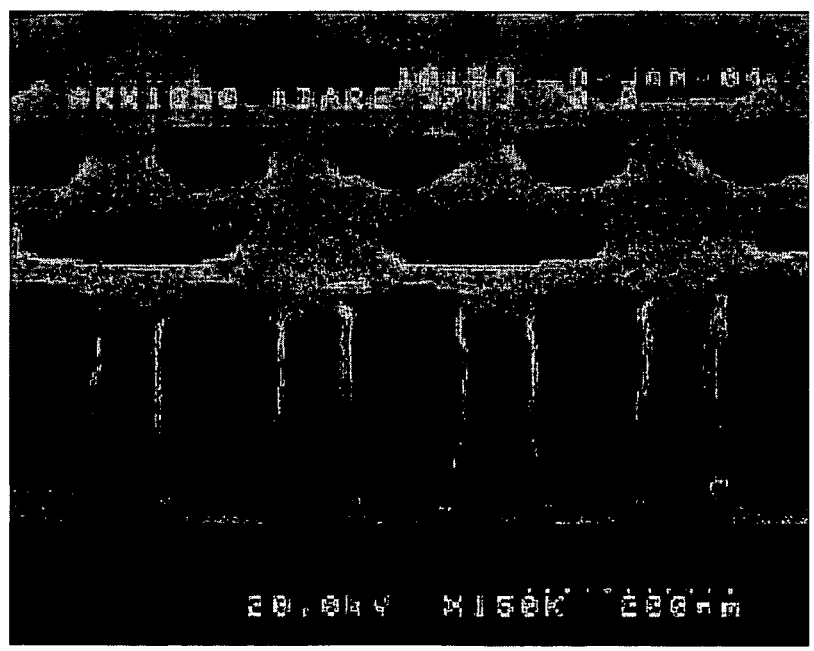
FIG. 8 is a SEM picture of a vertical profile of the fourth photoresist pattern.

FIG. 8 is a SEM picture of a vertical profile of the fourth photoresist pattern. As shown in FIG. 8, the fourth photoresist pattern on the amorphous silicon carbide layer had a profile substantially vertical to a top surface of the amorphous silicon carbide layer since a standing wave was not generated therefrom. The footing phenomenon was not observed at a bottom portion of the fourth photoresist pattern, and thus no residual photoresist compositions remained on the bottom surface of the fourth photoresist pattern. Further, a top portion of fourth photoresist pattern was not broken away.

COMPARATIVE EXPERIMENT 1

The first comparative photoresist composition was coated on a silicon substrate on which an anti-reflection layer and a BPSG layer were formed, and a baking process was performed on the substrate to thereby form a first comparative photoresist film to a thickness of about 800 Å. Then, the ArF excimer laser was projected to the first comparative photoresist film through a reticle positioned over the first comparative photoresist film including a mask pattern. Next, the first comparative photoresist film was selectively exposed to the ArF excimer laser in accordance with the mask pattern. A soft baking process, a developing process and a hard baking process were sequentially performed on the exposed first comparative photoresist film to thereby form a first comparative photoresist pattern. Then, the first comparative photoresist pattern was observed using an electron microscope, and a picture of a vertical profile of the first comparative photoresist pattern was obtained.

Figure 9:
FIG. 9 is a SEM picture of a vertical profile of the first comparative photoresist pattern.

FIG. 9 is a SEM picture of a vertical profile of the first comparative photoresist pattern. As shown in FIG. 9, the first comparative photoresist pattern on the BPSG layer had a poor vertical profile with respect to a top surface of the BPSG layer since a standing wave was generated therefrom. That is, the vertical profile was not represented as a vertical line, but instead was represented to be anfractuous with respect to the top surface of the BPSG layer. Accordingly, the first comparative photoresist pattern was not utilized as an etching mask for patterning the BPSG layer.

COMPARATIVE EXPERIMENT 2

The second comparative photoresist composition was coated on a silicon substrate on which an anti-reflection layer and a BPSG layer were formed, and a baking process was performed on the substrate to thereby form a second comparative photoresist film to a thickness of about 800 Å. Then, the ArF excimer laser was projected to the second comparative photoresist film through a reticle positioned over the second comparative photoresist film and including a mask pattern. Accordingly, the second comparative photoresist film was selectively exposed to the ArF excimer laser in accordance with the mask pattern. A soft baking process, a developing process and a hard baking process were sequentially performed on the exposed second comparative photoresist film to thereby form a second comparative photoresist pattern. Then, the second comparative photoresist pattern was observed using an electron microscope, and a picture of a vertical profile of the second comparative photoresist pattern was obtained.

Figure 10:
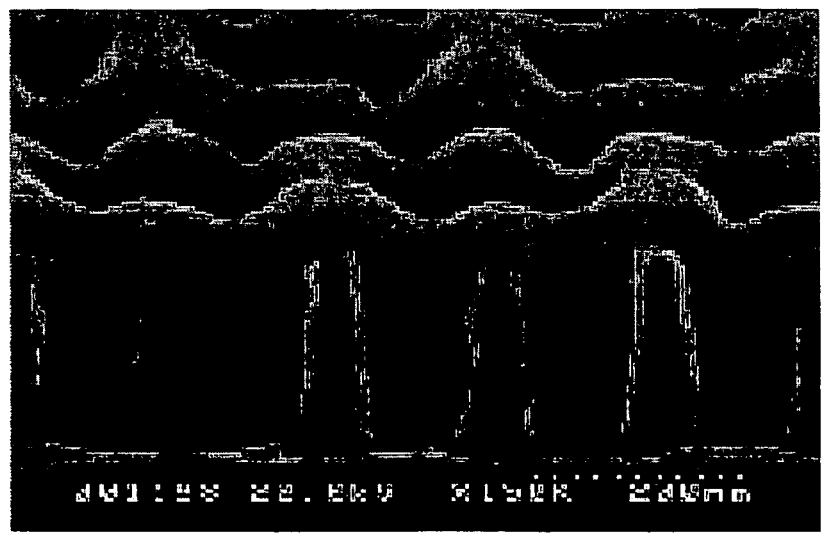
FIG. 10 is a SEM picture of a vertical profile of the second comparative photoresist pattern.

FIG. 10 is a SEM picture of a vertical profile of the second comparative photoresist pattern. As shown in FIG. 10, the second comparative photoresist pattern on the BPSG layer also had a poor vertical profile with respect to a top surface of the BPSG layer since a standing wave was generated therefrom. Accordingly, the second comparative photoresist pattern was not utilized as an etching mask for patterning the BPSG layer.

COMPARATIVE EXPERIMENT 3

The third comparative photoresist composition was coated on a silicon substrate on which an anti-reflection layer and a BPSG layer were formed, and a baking process was performed on the substrate to thereby form a third comparative photoresist film to a thickness of about 800 Å. Then, the ArF excimer laser was projected to the third comparative photoresist film through a reticle positioned over the third comparative photoresist film and including a mask pattern. Accordingly, the third comparative photoresist film was selectively exposed to the ArF excimer laser in accordance with the mask pattern. A soft baking process, a developing process and a hard baking process were sequentially performed on the exposed third comparative photoresist film to thereby form a third comparative photoresist pattern. Then, the third comparative photoresist pattern was observed using an electron microscope, and a picture of a vertical profile of the third comparative photoresist pattern was obtained.

Figure 11:
FIG. 11 is a SEM picture of a vertical profile of the third comparative photoresist pattern.

FIG. 11 is a SEM picture of a vertical profile of the third comparative photoresist pattern. As shown in FIG. 11, the third comparative photoresist pattern on the BPSG layer also had a poor vertical profile with respect to a top surface of the BPSG layer since a standing wave was generated therefrom. In addition, the footing phenomenon was observed at a bottom portion of the third comparative photoresist pattern, and thus residual photoresist compositions remained on the bottom surface of the third comparative photoresist pattern. Accordingly, there was a problem that the third comparative photoresist pattern was electrically connected on the whole.

COMPARATIVE EXPERIMENT 4

The fourth comparative photoresist composition was coated on a silicon substrate on which an anti-reflection layer and a BPSG layer were formed, and a baking process was performed on the substrate to thereby form a fourth comparative photoresist film to a thickness of about 800 Å. Then, the ArF excimer laser was projected to the fourth comparative photoresist film through a reticle positioned over the fourth comparative photoresist film and including a mask pattern. Accordingly, the fourth comparative photoresist film was selectively exposed to the ArF excimer laser in accordance with the mask pattern. A soft baking process, a developing process and a hard baking process were sequentially performed on the exposed fourth comparative photoresist film to thereby form a fourth comparative photoresist pattern. Then, the fourth comparative photoresist pattern was observed using an electron microscope, and a picture of a vertical profile of the fourth comparative photoresist pattern was obtained.

Figure 12:
FIG. 12 is a SEM picture of a vertical profile of the fourth comparative photoresist pattern.

FIG. 12 is a SEM picture of a vertical profile of the fourth comparative photoresist pattern. As shown in FIG. 12, the fourth comparative photoresist pattern on the BPSG layer also had a poor vertical profile with respect to a top surface of the BPSG layer since a standing wave was generated therefrom. In addition, the footing phenomenon was also observed at a bottom portion of the fourth comparative photoresist pattern, and thus residual photoresist compositions remained on the bottom surface of the fourth comparative photoresist pattern. Further, a top portion of fourth comparative photoresist pattern was considerably broken away.

According to the present invention, the absorbance of light and the generation rate of an acid are readily controlled in accordance with an object on which a photoresist film is formed using photoresist compositions of the invention, so that the footing phenomenon and the top loss of a pattern are sufficiently prevented. In addition, although the ArF excimer laser is utilized as a light source of an exposing system, a poor profile of a photoresist pattern due to a standing wave is prevented.

Therefore, the photoresist pattern comprising the photoresist compositions of the present invention improves a reliance of a semiconductor device, so that manufacturing cost and time are sufficiently reduced. In particular, when the photoresist compositions of the present invention are applied to manufacturing processes of a next generation semiconductor device, reduction of the manufacturing cost and time may be more remarkable and prominent.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A photoresist composition coated on an object to be patterned, the photoresist composition comprising:
   from about 0.1% to about 0.5% by weight of a photo acid generator (PAG) consisting essentially of a monophenyl sulfonium compound; and
   from about 2% to about 10% by weight of a polymer resin, wherein the object includes a silicon substrate on which an anti-reflection layer is formed, wherein footing phenomenon, poor profile of a photoresist pattern, and top loss of a photoresist pattern are substantially prevented.

2. The photoresist composition of claim 1, wherein the amount of the PAG is in a range of from about 0.15% to about 0.4% by weight based on a total weight of the photoresist composition.

3. A photoresist composition, coated on an object to be patterned, the photoresist composition comprising:
   from about 0.1% to about 0.5% by weight of a photo acid generator (PAG) consisting essentially of a monophenyl sulfonium compound; and
   from about 2% to about 10% by weight of a polymer resin, wherein the object is a polysilicon layer on which an anti-reflection layer is formed, wherein footing phenomenon, poor profile of a photoresist pattern, and top loss of a photoresist pattern are substantially prevented.

4. A photoresist composition, coated on an object to be patterned, the photoresist composition comprising:
   from about 0.1% to about 0.5% by weight of a photo acid generator (PAG) consisting essentially of a monophenyl sulfonium compound ; and
   from about 2% to about 10% by weight of a polymer resin, wherein the object includes an amorphous silicon carbide layer on which an anti-reflection layer is formed, wherein footing phenomenon, poor profile of a photoresist pattern, and top loss of a photoresist pattern are substantially prevented.

5. The photoresist composition of claim 1, wherein the polymer resin includes an acrylate, a methacrylate or an olefin.

6. A method of forming a pattern, the method comprising:
   providing a photoresist composition comprising from about 0.1% to about 0.5% by weight of a PAG, from about 2% to about 10% by weight of a polymer resin, and a residual of a solvent, the PAG consisting essentially of a monophenyl sulfonium compound;
   coating the photoresist composition onto an object and thereby forming a photoresist film, wherein the object includes a silicon substrate on which an anti-reflection layer is formed;
   selectively exposing the photoresist film using an illuminating light; and
   developing the selectively exposed photoresist film thereby forming a photoresist pattern, wherein footing phenomenon, poor profile of a photoresist pattern, and top loss of a photoresist pattern are substantially prevented.

7. A method of forming a pattern, the method comprising:
   providing a photoresist composition from about 0.1% to about 0.5% by weight of a PAG, and from about 2% to about 10% by weight of a polymer resin, the PAG consisting essentially of a monophenyl sulfonium compound
   coating the photoresist composition onto an object and thereby forming a photoresist film, wherein the object is a polysilicon layer on which an anti-reflection layer is formed;
   selectively exposing the photoresist film using an illuminating light; and
   developing the selectively exposed photoresist film thereby forming a photoresist pattern, wherein footing phenomenon, poor profile of a photoresist pattern, and top loss of a photoresist pattern are substantially prevented.

8. A method of forming a pattern, the method comprising:
   providing a photoresist composition comprising from about 0.1% to about 0.5% by weight of a PAG, from about 2% to about 10% by weight of a polymer resin, and a residual of a solvent, the PAG comprising a monophenyl sulfonium compound;

coating the photoresist composition onto an object and thereby forming a photoresist film, wherein the object includes an amorphous silicon carbide layer on which an anti-reflection layer is formed;

selectively exposing the photoresist film using an illuminating light; and developing the selectively exposed photoresist film thereby forming a photoresist pattern, wherein footing phenomenon, poor profile of a photoresist pattern, and top loss of a photoresist pattern are substantially prevented.

9. The method of claim 6, further comprising etching the object exposed through the photoresist pattern after developing the selectively exposed photoresist film.

10. The photoresist composition of claim 3, wherein the polymer resin includes an acrylate, a methacrylate or an olefin.

11. The photoresist composition of claim 4, wherein the polymer resin includes an acrylate, a methacrylate or an olefin.

12. The photoresist composition of claim 6, wherein the polymer resin includes an acrylate, a methacrylate or an olefin.

13. The photoresist composition of claim 7, wherein the polymer resin includes an acrylate, a methacrylate or an olefin.

14. The photoresist composition of claim 8, wherein the polymer resin includes an acrylate, a methacrylate or an olefin.

15. The photoresist composition of claim 3, wherein the amount of the PAG is in a range of from about 0.15% to about 0.4% by weight based on a total weight of the photoresist composition.

16. The photoresist composition of claim 4, wherein the amount of the PAG is in a range of from about 0.15% to about 0.4% by weight based on a total weight of the photoresist composition.

17. The photoresist composition of claim 6, wherein the amount of the PAG is in a range of from about 0.15% to about 0.4% by weight based on a total weight of the photoresist composition.

18. The photoresist composition of claim 7, wherein the amount of the PAG is in a range of from about 0.15% to about 0.4% by weight based on a total weight of the photoresist composition.

19. The photoresist composition of claim 8, wherein the amount of the PAG is in a range of from about 0.15% to about 0.4% by weight based on a total weight of the photoresist composition.

20. The method of claim 7, further comprising etching the object exposed through the photoresist pattern after developing the selectively exposed photoresist film.

21. The method of claim 8, further comprising etching the object exposed through the photoresist pattern after developing the selectively exposed photoresist film.

* * * * *

UNITED STATES PATENT AND TRADEMARK OFFICE
CERTIFICATE OF CORRECTION

| | |
|---|---|
| PATENT NO. | : 7,282,319 B2 |
| APPLICATION NO. | : 11/141736 |
| DATED | : October 16, 2007 |
| INVENTOR(S) | : Kyoung-Mi Kim et al. |

Page 1 of 1

It is certified that error appears in the above-identified patent and that said Letters Patent is hereby corrected as shown below:

Column 18, line 51-52, Claim 7 the word "compound" should read -- compound; --.

Signed and Sealed this

Thirtieth Day of September, 2008

JON W. DUDAS
*Director of the United States Patent and Trademark Office*